(12) United States Patent
Carothers et al.

(10) Patent No.: US 7,736,934 B2
(45) Date of Patent: Jun. 15, 2010

(54) METHOD FOR MANUFACTURING VERTICAL GERMANIUM DETECTORS

(75) Inventors: Daniel N. Carothers, Oro Valley, AZ (US); Craig M. Hill, Warrenton, VA (US); Andrew T. S. Pomerene, Leesburg, VA (US); Vu A. Vu, Falls Church, VA (US); Joe Giunta, Warrenton, VA (US); Jonathan N. Ishii, Fredericksburg, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 12/517,712

(22) PCT Filed: Oct. 20, 2008

(86) PCT No.: PCT/US2008/080471

§ 371 (c)(1),
(2), (4) Date: Jun. 4, 2009

(87) PCT Pub. No.: WO2009/052479

PCT Pub. Date: Apr. 23, 2009

(65) Prior Publication Data

US 2010/0029033 A1  Feb. 4, 2010

Related U.S. Application Data

(60) Provisional application No. 60/999,717, filed on Oct. 19, 2007.

(51) Int. Cl.
*H01L 21/00* (2006.01)

(52) U.S. Cl. .................................... 438/57
(58) Field of Classification Search .................... None
See application file for complete search history.

(56) References Cited

U.S. PATENT DOCUMENTS 4,420,258 A    12/1983  Burns et al.

(Continued)

FOREIGN PATENT DOCUMENTS

EP         0 818 693          1/1998

(Continued)

OTHER PUBLICATIONS

Pruessner et al., "InP-Based Optical Waveguide MEMS Switches with Evanescent Coupling Mechanism", Journal of Microelectromechanical Systems, vol. 14, No. 5, Oct. 2005.

(Continued)

*Primary Examiner*—Scott B Geyer
(74) *Attorney, Agent, or Firm*—Dillon & Yudell LLP; Antony Ng; Daniel J. Long

(57) ABSTRACT

An improved method for manufacturing a vertical germanium detector is disclosed. Initially, a detector window is opened through an oxide layer on a single crystalline substrate. Next, a single crystal germanium layer is grown within the detector window, and an amorphous germanium layer is grown on the oxide layer. The amorphous germanium layer is then polished and removed until only a portion of the amorphous germanium layer is located around the single crystal germanium layer. A tetraethyl orthosilicate (TEOS) layer is deposited on the amorphous germanium layer and the single crystal germanium layer. An implant is subsequently performed on the single crystal germanium layer. After an oxide window has been opened on the TEOS layer, a titanium layer is deposited on the single crystal germanium layer to form a vertical germanium detector.

10 Claims, 4 Drawing Sheets

U.S. PATENT DOCUMENTS

| | | | |
|---|---|---|---|
| 4,547,072 | A | 10/1985 | Yoshida et al. |
| 4,748,617 | A | 5/1988 | Drewlo |
| 4,921,354 | A | 5/1990 | SooHoo |
| 5,165,001 | A | 11/1992 | Takagi et al. |
| 5,281,805 | A | 1/1994 | Sauer |
| 5,371,591 | A | 12/1994 | Martin et al. |
| 5,430,755 | A | 7/1995 | Perlmutter |
| 5,625,636 | A | 4/1997 | Bryan et al. |
| 5,674,778 | A | 10/1997 | Lee et al. |
| 5,703,989 | A | 12/1997 | Khan et al. |
| 5,736,461 | A | 4/1998 | Berti et al. |
| 5,828,476 | A | 10/1998 | Bonebright et al. |
| 5,834,800 | A | 11/1998 | Jalali-Farahani et al. |
| 6,117,771 | A | 9/2000 | Murphy et al. |
| 6,242,324 | B1 | 6/2001 | Kub et al. |
| 6,331,445 | B1 | 12/2001 | Janz et al. |
| 6,387,720 | B1 | 5/2002 | Misheloff et al. |
| 6,400,996 | B1 | 6/2002 | Hoffberg et al. |
| 6,477,285 | B1 | 11/2002 | Shanley |
| 6,605,809 | B1 | 8/2003 | Engels et al. |
| 6,677,655 | B2 | 1/2004 | Fitzergald |
| 6,680,495 | B2 | 1/2004 | Fitzergald |
| 6,738,546 | B2 | 5/2004 | Deliwala |
| 6,785,447 | B2 | 8/2004 | Yoshimura et al. |
| 6,795,622 | B2 | 9/2004 | Forrest et al. |
| 6,850,252 | B1 | 2/2005 | Hoffberg |
| 6,861,369 | B2 | 3/2005 | Park |
| 6,936,839 | B2 | 8/2005 | Taylor |
| 6,968,110 | B2 | 11/2005 | Patel et al. |
| 7,006,881 | B1 | 2/2006 | Hoffberg et al. |
| 7,010,208 | B1 | 3/2006 | Gunn, III et al. |
| 7,043,106 | B2 | 5/2006 | West et al. |
| 7,072,556 | B1 | 7/2006 | Gunn, III et al. |
| 7,082,247 | B1 | 7/2006 | Gunn, III et al. |
| 7,103,252 | B2 | 9/2006 | Ide |
| 7,139,448 | B2 | 11/2006 | Jain et al. |
| 7,215,845 | B1 | 5/2007 | Chan et al. |
| 7,218,809 | B2 | 5/2007 | Zhou et al. |
| 7,218,826 | B1 | 5/2007 | Gunn, III et al. |
| 7,259,031 | B1 | 8/2007 | Dickson et al. |
| 7,272,279 | B2 | 9/2007 | Ishikawa et al. |
| 7,315,679 | B2 | 1/2008 | Hochberg et al. |
| 7,333,679 | B2 | 2/2008 | Takahashi |
| 7,348,230 | B2 | 3/2008 | Matsuo et al. |
| 7,356,221 | B2 | 4/2008 | Chu et al. |
| 2003/0026546 | A1 | 2/2003 | Deliwala |
| 2003/0183825 | A1 | 10/2003 | Morse |
| 2004/0146431 | A1 | 7/2004 | Scherer et al. |
| 2004/0190274 | A1 | 9/2004 | Saito et al. |
| 2005/0094938 | A1 | 5/2005 | Ghiron et al. |
| 2006/0158723 | A1 | 7/2006 | Voigt et al. |
| 2006/0238866 | A1 | 10/2006 | Von Lerber |
| 2006/0240667 | A1 | 10/2006 | Matsuda et al. |
| 2007/0099329 | A1 | 5/2007 | Maa et al. |
| 2007/0116398 | A1 | 5/2007 | Pan et al. |
| 2007/0161142 | A1 | 7/2007 | Mouli et al. |
| 2007/0202254 | A1 | 8/2007 | Ganguli et al. |
| 2008/0159751 | A1 | 7/2008 | Matsui et al. |
| 2008/0240180 | A1 | 10/2008 | Matsui et al. |

FOREIGN PATENT DOCUMENTS

| | | |
|---|---|---|
| EP | 1 067 409 | 1/2001 |
| WO | 93/14514 | 7/1993 |
| WO | 01/27669 | 4/2001 |
| WO | 02/16986 | 2/2002 |
| WO | 2004088724 | 10/2004 |
| WO | 2007149055 | 12/2007 |

OTHER PUBLICATIONS

May et al., "Integrated Process for Silicon Nitride Waveguide Fabrication", IBM Technical Disclosure Bulletin, vol. 33, No. 2, Jul. 1990.

Matsushita et al., "Narrow CoSi2 Line Formation on SiO2 by Focused Ion Beam", IEEE Xplore 1999.

"Process Integration", Cobalt Self-aligned Silicide Process, Chapter 13.

Liu et al., "Design of Monolithically Integrated GeSi Electro-absorption Modulators and Photodetectors on an SOI Plaform", Optics Express 623, vol. 15, No. 2, Jan. 22, 2007.

Fijol et al., "Fabrication of Silicon-on-insulator Adiabatic Tapers for Low Loss Optical Interconnection of Photonic Devices".

Yap et al., "Integrated Opteoelectronic Circuits with InP-based HBTs", Proceedings of SPIE, vol. 4290, 2001.

Roth, "Electroabsorption Modulators for CMOS Compatible Optical Interconnects in III-V and Group IV Materials", Aug. 2007, (part 1 of 3).

Roth, "Electroabsorption Modulators for CMOS Compatible Optical Interconnects in III-V and Group IV Materials", Aug. 2007, (part 2 of 3).

Roth, "Electroabsorption Modulators for CMOS Compatible Optical Interconnects in III-V and Group IV Materials", Aug. 2007, (part 3 of 3).

Kimberling et al., "Electronic-photonic Integrated Circuits on the CMOS Platform".

Chao et al., "Analysis of Temperature Profiles of Thermo-optic Waveguides", Fiber and Integrated Optics, vol. 33.

Okyay et al., "Silicon Germanium CMOS Optoelectronic Switching Device: Bringing Light to Latch", IEEE Transactions on Electron Devices, vol. 54, No. 12, Dec. 2007.

McAulay et al., "All-optical Switching and Logic with an Integrated Optic Microring Resonator", Proc. of SPIE vol. 5814.

Kik et al, "Erbium Doped Optical Waveguide Amplifiers on Silicon", MRS Bulletin 23(4), 48, Apr. 1998.

Kimmet, J. S., "M.S. Thesis: Integrated Circuit Fabrication Details," Rutgers University, 1999; 18 pp.

METHOD FOR MANUFACTURING VERTICAL GERMANIUM DETECTORS

PRIORITY CLAIM

The present application claims priority under 35 U.S.C. §119(e)(1) to provisional application No. 60/999,717, filed on Oct. 19, 2007, the contents which are incorporated herein by reference.

STATEMENT OF GOVERNMENT INTEREST

The present invention was made with United States Government assistance under Contract No. HR0011-05-C-0027 awarded by Defense Advanced Research Projects Agency (DARPA). The United States Government has certain rights in the present invention.

RELATED APPLICATION

The present application is related to co-pending application Ser. No. 12/201,943 filed on Aug. 29, 2008, the contents of which are incorporated herein by reference.

BACKGROUND OF THE INVENTION

1. Technical Field

The present invention relates to optical detectors in general, and in particular to a method for manufacturing vertical germanium detectors.

2. Description of Related Art

Photodetection in the near-infrared (IR) regime has many applications, such as telecommunications, thermal imaging, etc. InGaAs-based PIN photodetectors are commonly used for telecommunication applications due to their high responsivity and speed. However, the majority of the InGaAs-based detectors are normal incidence detectors, and the integration of such devices on silicon surfaces can be very expensive. Also, integration of high-speed InGaAs detectors requires special optics to focus light into a small active area, which has been found to reduce device performance.

Germanium-based detectors are known to be a suitable alternative. However, germanium-based detectors exhibit a higher dark current than InGaAs-based detectors, which limit their application in the telecommunications industry. In recent years, attempts have been made to improve the performance of polycrystalline germanium-based detectors for these applications. One exemplary prior art poly-germanium detector is described by Colace et al. in an article entitled *Efficient high-speed near-infrared Ge photodetectors integrated on Si substrates* (Applied Physics Letters, vol. 76, p. 1231 et seq., 2000).

The present disclosure provides an improved method for manufacturing vertical germanium-based detectors.

SUMMARY OF THE INVENTION

In accordance with a preferred embodiment of the present invention, a detector window is initially opened through an oxide layer on a single crystalline substrate. Next, a single crystal germanium layer is grown within the detector window, and an amorphous germanium layer is grown on the oxide layer. The amorphous germanium layer is then polished and removed until only a portion of the amorphous germanium layer is located around the single crystal germanium layer. A tetraethyl orthosilicate (TEOS) layer is deposited on the amorphous germanium layer and the single crystal germanium layer. An implant is subsequently performed on the single crystal germanium layer. After an oxide window has been opened on the TEOS layer, a titanium layer is deposited on the single crystal germanium layer to form a germanium detector.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
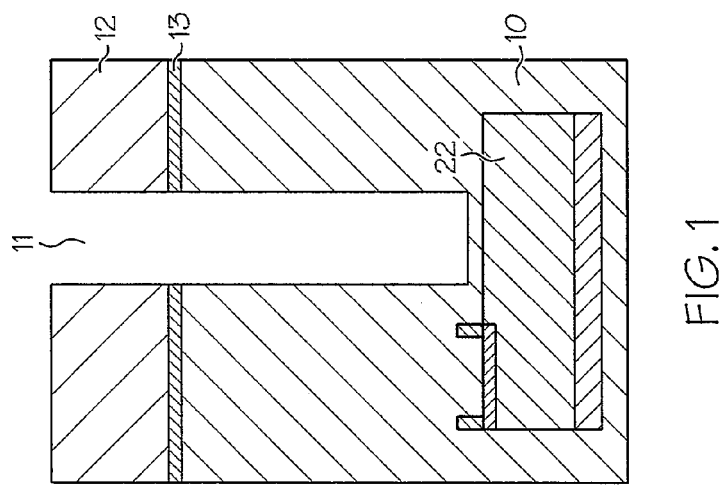
FIGS. 1-7 illustrate successive steps of a method for fabricating a vertical germanium-based detector, in accordance with a preferred embodiment of the present invention.

Referring now to the drawings and in particular to FIGS. 1-7, there are illustrated successive steps of a method for fabricating a vertical germanium-based detector, in accordance with a preferred embodiment of the present invention. Initially, a dry etch process is utilized to open a detector window 11 through a resist layer 12, a nitride layer 13 and an oxide layer 10 on an n+ doped single crystalline substrate having an implant 22 for detectors, as shown in FIG. 1.

Figure 2:
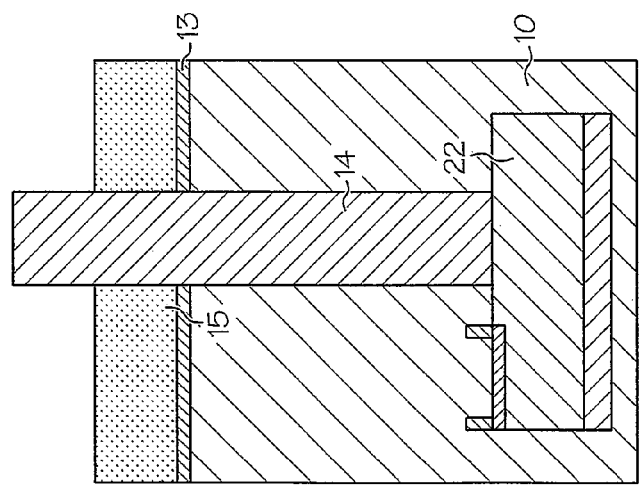

A single crystal germanium layer 14 is then grown within detector window 11, as depicted in FIG. 2. The germanium growth process uses silicon and silicon-germanium seed layers to achieve an abrupt transition to the germanium growth by controlling the surface energy states that the germanium can adhere to as the germanium growth temperature is being modified. The usage of the seed layers allows for a subsequent single crystal germanium growth, even across very large exposed single crystal silicon regions. In addition, the silicon seed layer makes the deposition non-selective to the dielectric region, so an amorphous germanium layer can be grown on top of the oxide mask. This amorphous germanium layer serves as a sacrificial polish layer for subsequent processing. Three different gases are used for the growth of the germanium layer, namely, hydrogen, 100% silane ($SiH_4$), and 100% germane ($GeH_4$). The growth process includes six steps, as follows:

Step 1: Preconditioning with hydrogen at 750° C. for 60 minutes. The pressure is controlled at 3 $E^{-4}$ mBar.

Step 2: Ramp down to 550° C. in 100 minutes in vacuum at 20° C./min. Silane gas is flowed and controlled at 5 $E^{-4}$ mBar for 10 minutes.

Step 3: Ramp down to 500° C. in 30 minutes in vacuum at 20° C./min. A 6:4 mixture of silane and germane gases is controlled at 5 $E^{-4}$ mBar for 30 minutes.

Step 4: A 4:6 mixture of silane and germane gases is controlled at 5 $E^{-4}$ mBar for 30 minutes.

Step 5: Ramp up to 750° C. in 125 minutes in vacuum at 20° C./min. Hydrogen gas is flowed and controlled at 5 $E^{-4}$ mBar for 240 minutes.

Step 6: Ramp down to 600° C. in 75 minutes in vacuum at 20° C./min. Germane gas is flowed and controlled at 1.5 $E^{-3}$ mBar for 600 minutes. 1.5 um of intrinsic single crystal germanium is grown at 600° C.

Figure 3:
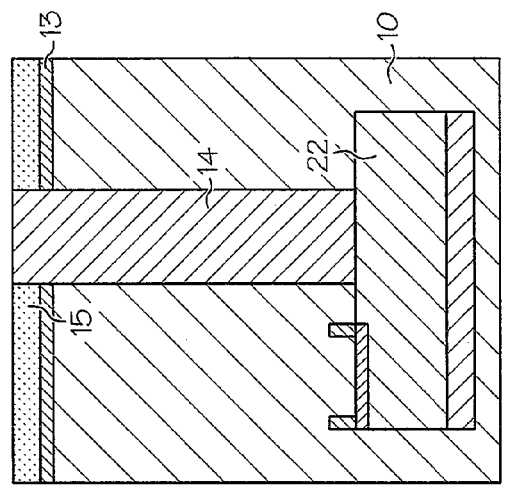

Single crystal germanium layer 14 and amorphous germanium layer 15 are then polished via a chemical mechanical polish (CMP), as shown in FIG. 3. It is preferable to stop the CMP process before amorphous germanium layer 15 is completely removed. This is because polishing too far can expose voids and crystalline defects that tend to form at the edge of oxide window 11 and single crystal germanium layer 14, and polishing too close to the crystalline defects can create voids by tearing out entire crystalline defects.

Figure 4:
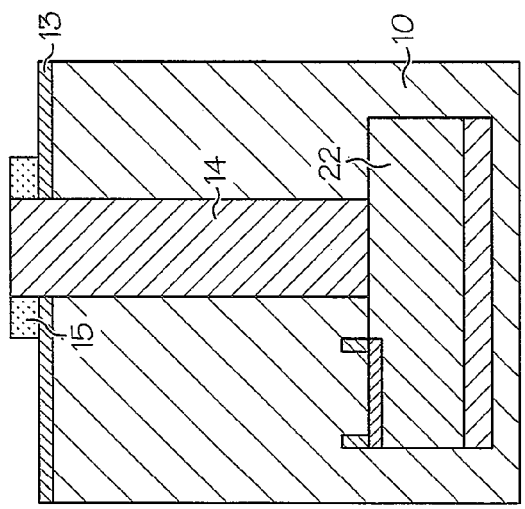

Using a mask, the remaining portion of amorphous germanium layer 15 is removed via a dry etch, leaving a portion of amorphous germanium layer 15 located around single crystal germanium layer 14, as depicted in FIG. 4.

Figure 5:
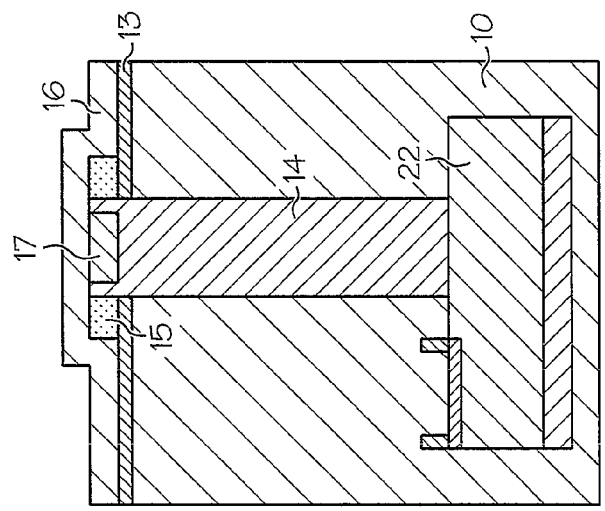

After a tetraethyl orthosilicate (TEOS) layer 16 has been deposited on amorphous germanium layer 15 and single crystal germanium layer 14, a p+ implant region 17 is created on single crystal germanium layer 14 via a mask and the dopant is activated using an anneal, as shown in FIG. 5. TEOS layer 16 may be replaced by other types of oxides or dielectrics including nitride. For example, germanium oxy-nitride can be used instead of TEOS in layer 16 in order to lower the stress over amorphous germanium layer 15, which should reduce noise and dark current. TEOS layer 16 is utilized to seal the edge of a germanium detector at which defects and voids are most prone to be formed. Preferably, an implant mask is utilized to keep the p+ dopant away from the defects and voids at the edge of single crystal germanium layer 14. Keeping the p+ dopant away from the defect prone edge region decreases detector noise and dark current.

Figure 6:
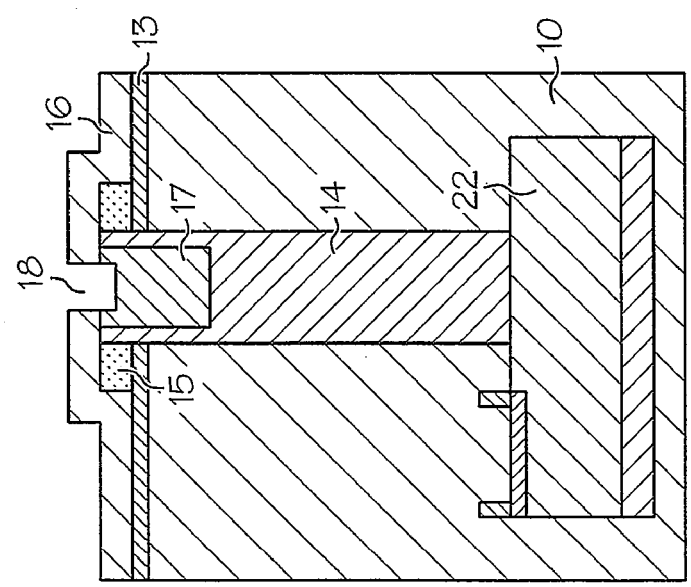

TEOS (or germanium oxy-nitride) layer 16 is then patterned using a resist mask and a dry etch is utilized to open an oxide window 18, as depicted in FIG. 6. Oxide window 18 exposes germanium regions for a subsequent germanide formation. In order to prevent detector leakage, oxide window 18 must be confined well within p+ doped germanium region 17. Keeping doped germanium region 17 and germanide regions away from the edges of single crystal germanium layer 14 can reduce detector noise and dark current.

Figure 7:
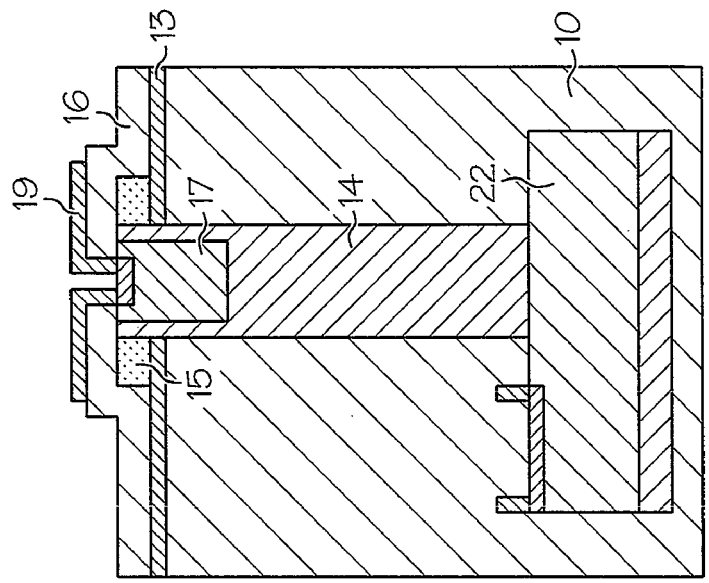

A titanium deposition is performed on single crystal germanium layer 14 that is exposed through oxide window 18. One or more heat treatments are then used to form a TiGe material 19 within oxide window 18, as shown in FIG. 7. At this point, a P-i-N germanium detector having a vertical configuration is formed, and conventional semiconductor processing techniques may be utilized to fabricate dielectrics and contacts at the top of the P-i-N germanium detector.

Any un-reacted titanium over TEOS layer 16 can be removed using a resist mask and dry etch. Using a wet process to remove the un-reacted titanium generates concerns of creating voids in the underlying germanium or even removing the germanide itself. The processing options are not limited to titanium germanide as any refractory metal may be used to form the germanide, especially titanium and nickel for underlying p+ germanium, and erbium, zirconium and ytterbium for underlying n+ germanium.

As has been described, the present invention provides an improved method for manufacturing a vertical germanium detector. Although the process described above is intended for an underlying n+ silicon layer and a p+ doped germanium layer, it is understood by those skilled in the art that the same principle can be applied to an underlying p+ silicon layer and an n+ doped germanium layer.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a vertical germanium detector, said method comprising:

opening a detector window through an oxide layer on a single crystalline substrate;

growing a single crystal germanium layer within said detector window, and an amorphous germanium layer on said oxide layer;

polishing and removing said amorphous germanium layer until a portion of said amorphous germanium layer is located around said single crystal germanium layer;

depositing a dielectric layer on said amorphous germanium layer and said single crystal germanium layer;

performing an implant on said single crystal germanium layer;

opening an oxide window on said dielectric layer; and depositing a refractory metal layer on said single crystal germanium layer to form a germanide layer and a germanium detector.

2. The method of claim 1, wherein said germanium detector is in a P-i-N configuration.

3. The method of claim 1, wherein said germanium detector includes an underlying n+ silicon layer and a p+ doped germanium layer.

4. The method of claim 1, wherein said germanium detector includes an underlying p+ silicon layer and an n+ doped germanium layer.

5. The method of claim 1, wherein said dielectric layer is a tetraethyl orthosilicate layer.

6. The method of claim 1, wherein said dielectric layer is a germanium oxy-nitride layer.

7. The method of claim 1, wherein said implant is confined within said detector window.

8. The method of claim 1, wherein said refractory metal deposition is confined within said detector window.

9. The method of claim 1, wherein said amorphous germanium layer is completely removed around said single crystal germanium layer.

10. The method of claim 1, wherein said refractory metal deposition is an element selected from the group consisting of titanium, nickel, palladium, platinum, erbium, zirconium, ytterbium, cobalt, zirconium and cobalt.

* * * * *